(12) United States Patent
Lu et al.

(10) Patent No.: US 7,135,257 B2
(45) Date of Patent: Nov. 14, 2006

(54) MULTI-STEP PHASE SHIFT MASK AND METHODS FOR FABRICATION THEREOF

(75) Inventors: Ming Lu, Taipei (TW); Bin-Chang Chang, Hsin-Chu (TW); Li-Wei Kung, Jhonghe (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 308 days.

(21) Appl. No.: 10/693,989

(22) Filed: Oct. 22, 2003

(65) Prior Publication Data

US 2005/0089764 A1 Apr. 28, 2005

(51) Int. Cl.
*G01F 9/00* (2006.01)
*G03C 5/00* (2006.01)

(52) U.S. Cl. .......................................... 430/5; 430/323

(58) Field of Classification Search ............... 430/5, 430/322–324, 394
See application file for complete search history.

(56) References Cited

U.S. PATENT DOCUMENTS 5,932,378 A * 8/1999 Lee .............................. 430/5

* cited by examiner

*Primary Examiner*—S. Rosasco
(74) *Attorney, Agent, or Firm*—Tung & Associates

(57) ABSTRACT

A phase shift mask comprises a transparent substrate having a patterned opaque material layer formed thereupon to form a non-transmissive region of the transparent substrate and an adjoining transmissive region of the transparent substrate. A pit is formed within the transmissive region of the transparent substrate. The pit has a stepped sidewall such as to provide the phase shift mask with enhanced optical performance. The phase shift mask may be fabricated employing a self aligned method.

17 Claims, 4 Drawing Sheets

MULTI-STEP PHASE SHIFT MASK AND METHODS FOR FABRICATION THEREOF

BACKGROUND OF THE INVENTION

1. Field of the Invention

The invention relates generally to photomasks employed for fabricating microelectronic products. More particularly, the invention relates to phase shift photomasks employed for fabricating microelectronic products.

2. Description of the Related Art

Microelectronic products are formed incident to successive photolithographic processes that are employed for forming microelectronic devices and patterned microelectronic structures over microelectronic substrates.

The successive photolithographic processes employ photomasks for purposes of exposing blanket photoresist layers when forming patterned photoresist layers. In turn, the patterned photoresist layers are employed for forming the microelectronic devices and patterned microelectronic structures. Of the types of photomasks that may be employed when fabricating microelectronic products, phase shift photomasks are particularly desirable insofar as phase shift photomasks employ photoexposure light phase shifting such as to provide enhanced resolution of photoexposure light and thus enhanced resolution of patterned photoresist layers. Of the types of phase shift photomasks that may be employed when fabricating microelectronic products, alternating phase shift photomasks are common. Alternating phase shift photomasks are related to conventional photomasks that employ a patterned opaque material layer upon a transparent substrate to provide alternating transmissive regions and non-transmissive regions of the transparent substrate. However, alternating phase shift photomasks also employ a pit within alternating transmissive regions of the transparent substrate separated by the patterned opaque material layer. The pit is typically formed of a depth to provide a 180 degree phase shift of a photoexposure light beam for adjacent transmissive regions when employing the phase shift photomask.

While alternating phase shift photomasks are common and highly desirable in the microelectronic product fabrication art, they are nonetheless not entirely without problems. In that regard, while alternating phase shift photomasks do provide enhanced resolution of photoexposure light, they nonetheless also often provide the enhanced resolution with attendant optical asperities, such as ghost images.

It is thus desirable to provide phase shift photomasks with enhanced optical performance. The invention is directed towards the foregoing object.

SUMMARY OF THE INVENTION

A first object of the invention is to provide a phase shift photomask and a method for fabricating the phase shift photomask.

A second object of the invention is to provide the phase shift photomask and the method in accord with the first object of the invention, wherein the phase shift photomask has enhanced optical performance.

In accord with the objects of the invention, the invention provides a phase shift photomask and a pair of methods for fabricating the phase shift photomask.

In accord with the invention, the phase shift photomask comprises a transparent substrate. The phase shift photomask also comprises a patterned opaque material layer formed upon the transparent substrate to define a non-transmissive region of the transparent substrate aligned beneath the patterned opaque material layer and an adjoining transmissive region of the transparent substrate not aligned beneath the patterned opaque material layer. Within the invention, the transmissive region has formed therein a pit having a stepped sidewall.

Within the invention, the phase shift photomask is preferably an alternating phase shift photomask.

The invention also provides a pair of methods for forming the pit having the stepped sidewall within the transmissive region.

The invention provides a phase shift photomask with enhanced performance and a pair of methods for fabricating the phase shift photomask.

The invention realizes the foregoing object generally and preferably in accord with an alternating phase shift photomask comprising a transparent substrate having formed thereupon a patterned opaque material layer that defines a non-transmissive region of the transparent substrate which separates a pair of transmissive regions of the transparent substrate. Within the alternating phase shift photomask, a pit is formed within one of the pair of transmissive regions of the transparent substrate, but generally not the other.

Within the invention, the stepped sidewall within the pit provides for enhanced optical performance of the phase shift photomask, such as attenuated ghost image formation when photoexposing a blanket photoresist layer when forming a patterned photoresist layer while employing the phase shift photomask.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a phase shift photomask with enhanced performance and a pair of methods for fabricating the phase shift photomask.

The invention realizes the foregoing object typically in accord with an alternating phase shift photomask comprising a transparent substrate having formed thereupon a patterned opaque material layer that defines a non-transmissive region of the transparent substrate that separates a pair of transmissive regions of the transparent substrate. Within the alternating phase shift photomask, a pit having a stepped sidewall is formed within one of the pair of transmissive regions of the transparent substrate.

First Preferred Embodiment

FIG. 1 to FIG. 8 show a series of schematic cross-sectional diagrams illustrating the results of progressive stages of fabricating a phase shift photomask in accord with a first preferred embodiment of the invention.

Figure 1:
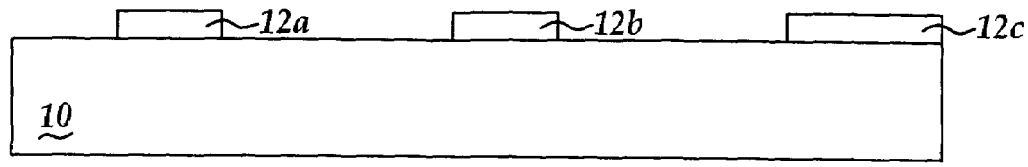
FIG. 1, FIG. 2, FIG. 3, FIG. 4, FIG. 5, FIG. 6, FIG. 7 and FIG. 8 show a series of schematic cross-sectional diagrams illustrating the results of progressive stages in forming an alternating phase shift photomask in accord with a first preferred embodiment of the invention.
Figure 2:
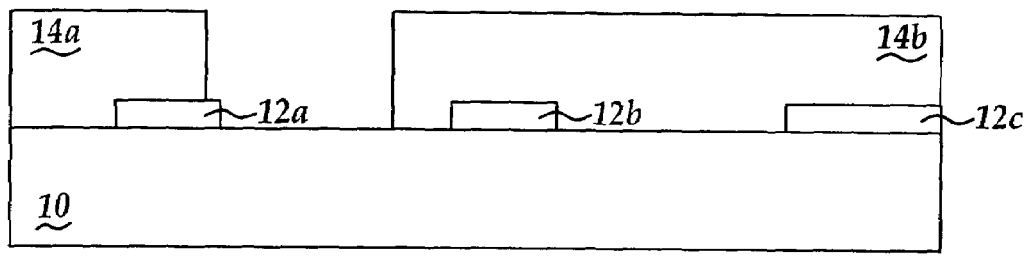

FIGS. 1 and 2 show a transparent substrate 10. A series of patterned opaque material layers 12a, 12b and 12c are formed upon the transparent substrate 10. FIG. 2 further shows a pair of patterned photoresist layers 14a and 14b that defines an aperture that exposes a portion of the transparent substrate 10.

The transparent substrate 10 is typically formed of a transparent material such as but not limited to quartz or glass, typically formed to a thickness of from about 1 mm to about 10 mm. The series of patterned opaque material layers 12a, 12b and 12c may be formed of reflective opaque materials or absorptive opaque materials. Typically, the series of patterned opaque material layers 12a, 12b and 12c are formed of a chromium reflective opaque material formed to a thickness of from about 300 to about 700 angstroms. In FIG. 2, the pair of patterned photoresist layers 14a and 14b may be formed of photoresist materials as are conventional in the microelectronic product fabrication art, including but not limited to photoresist materials selected from the group including but not limited to positive photoresist materials and negative photoresist materials. Typically, each of the pair of patterned photoresist layers 14a and 14b is formed to a thickness of from about 10000 to about 20000 angstroms.

As is understood by a person skilled in the art, regions of the transparent substrate 10 having formed thereupon the series of patterned opaque material layers 12a, 12b or 12c (and layers further derived therefrom) are non-transmissive regions of the transparent substrate 10. Regions of the transparent substrate 10 not having formed thereupon the series of patterned opaque material layers 12a, 12b and 12c (and related enlarged regions thereof derived from lateral (i.e., horizontal) etching of the patterned opaque material layer 12a are transmissive regions of the transparent substrate 10.

Figure 3:
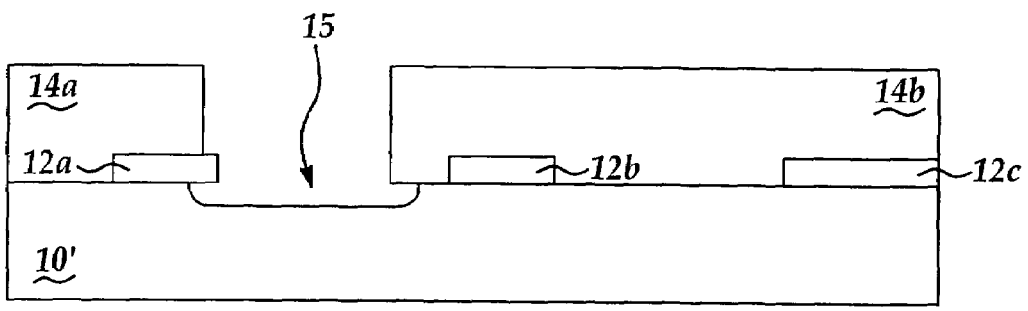

FIG. 3 shows the results of isotropically etching the transparent substrate 10 to form a once isotropically etched transparent substrate 10' having formed therein a pit 15 that extends isotropically and laterally beneath the patterned opaque material 12a.

Within the invention, the isotropic etching of the transparent substrate 10 to form the once isotropically etched transparent substrate 10' having formed therein the pit 15 may be undertaken employing an isotropic etchant selected from the group including but not limited to wet chemical isotropic etchants and dry plasma isotropic etchants. Wet chemical isotropic etchants will typically include aqueous hydrofluoric acid solutions. Dry plasma isotropic etchants will typically employ fluorine containing etchant gas compositions at generally higher reactor chamber pressures (i.e., from about 10 to about 50 torr). The pit 15 is formed within the once isotropically etched transparent substrate 10'. The pit depth corresponds to the optical phase difference which causes 60 degree phase change of photoexposure radiation.

Figure 4:
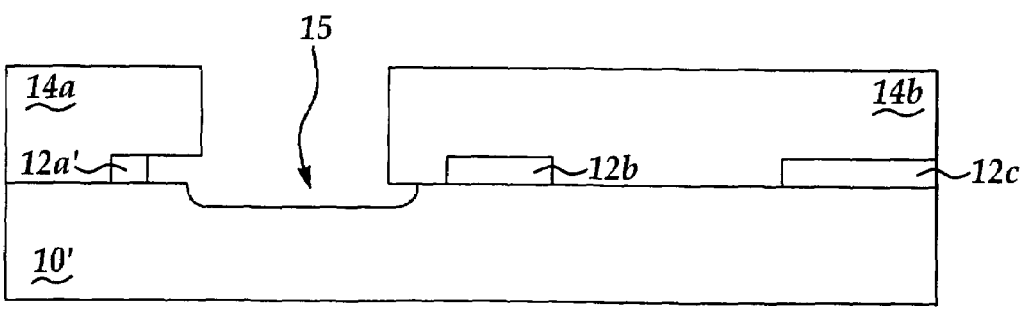

FIG. 4 shows the results of laterally (i.e., horizontally) etching back the patterned opaque material layer 12a to provide once laterally etched patterned opaque material layers 12a' that exposes an upper edge of the pit 15, while employing the pair of patterned photoresist layers 14a and 14b as a mask. The laterally etched may be done by an aqueous potassium permanganate and hydrogen peroxide etchant.

Figure 5:
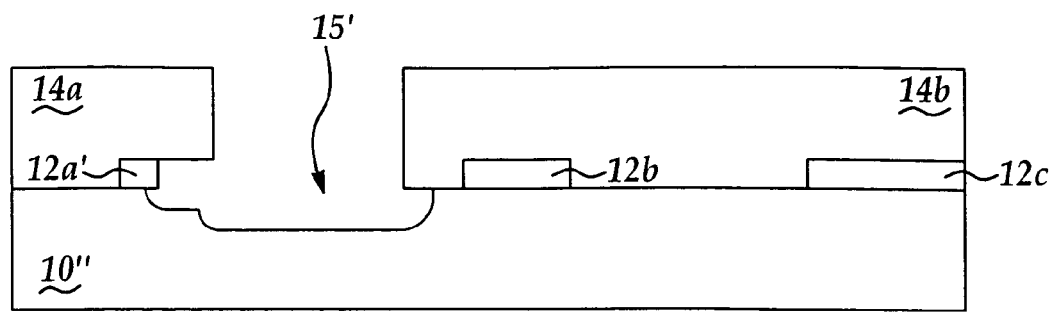

FIG. 5 shows the results of a further isotropic etching of the once isotropically etched transparent substrate 10' having formed therein the pit 15 to form a twice isotropically etched transparent substrate 10'' having formed therein a further etched pit 15'. As is illustrated in FIG. 5, one side of the further etched pit 15' has a stepped sidewall and on the other side where protected by photoresist 14b has an arc shaped sidewall absent a step or discontinuity therein. The stepped sidewall is formed as an aggregate of two arc shaped sidewall steps (formed incident to isotropic etching), where each step has a depth within the twice isotropically etched transparent substrate 10''. The overall pit depth corresponds to the optical path difference which causes 120 degree phase difference of photo exposure radiation.

Figure 6:
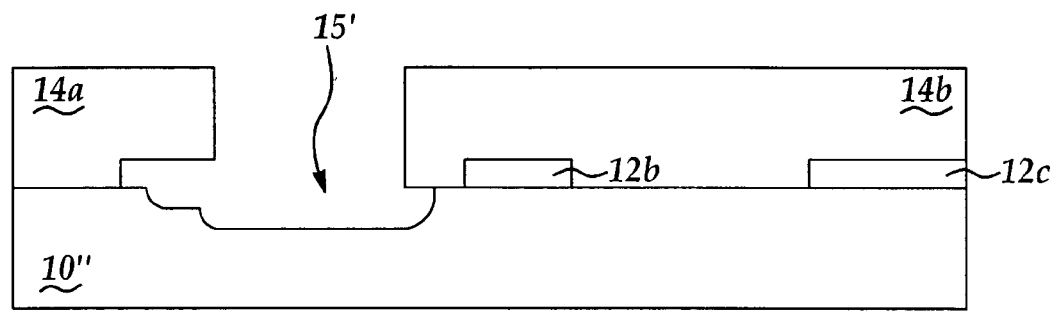

FIG. 6 shows the results of further lateral etching to remove the patterned opaque material layer 12a' to expose the edge of the further etched pit 15'. Such additional lateral etching may employ an identical isotropic etchant as employed within the previous lateral etching as illustrated within FIG. 4.

Figure 7:
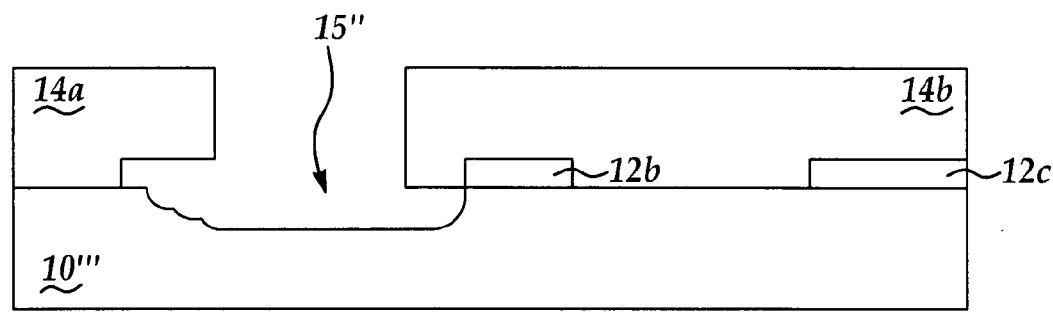

FIG. 7 illustrates the results of further isotropic etching of the twice isotropically etched transparent substrate 10'' having formed therein the further etched pit 15' to form a three times isotropically etched transparent substrate 10''' having formed therein a still further etched pit 15''. The still further etched pit 15'' has a stepped sidewall comprising a series of three arc shaped steps. The overall pit depth corresponds to the optical phase difference which causes 180 degrees phase change of photo exposure radiation. Each step corresponds to the optical difference which causes 60 degree phase change of photoexposure radiation. The additional isotropic etching may be undertaken employing the same isotropic etchant as employed for forming the pit 15 as illustrated in FIG. 3 or the further etched pit 15' as illustrated in FIG. 5.

Figure 8:
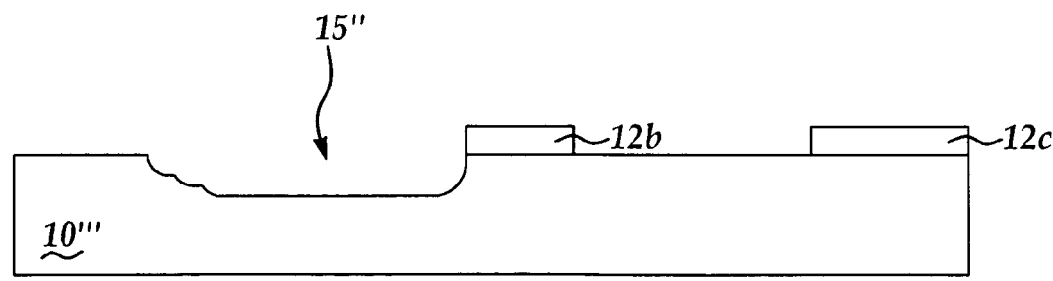

FIG. 8 illustrates the results of stripping the pair of patterned photoresist layers 14a and 14b from the phase shift photomask as illustrated in FIG. 7, to form an alternating phase shift photomask in accord with the first preferred embodiment of the invention. The alternating phase shift photomask comprises a transparent substrate having formed thereupon a patterned opaque material layer that defines a non-transmissive region of the transparent substrate. The non-transmissive region of the transparent substrate adjoins and separates a pair of transmissive regions not having the patterned opaque material layer formed thereupon. One of the pair of transmissive regions of the transparent substrate has formed therein a pit. The total height difference between the pit depth and the un-etched adjoining transparent substrate plane corresponds to the optical path difference which causes 180 phase change of photoexposure radiation.

While the first preferred embodiment of the invention (and as will be illustrated below in accord with the second preferred embodiment of the invention) employs three steps within a stepped sidewall pit, the invention is not intended to be so limited. Rather, the invention may employ a minimum of two steps (i.e. defined by one discontinuity) within the sidewall of a pit within a transmissive region of a phase shift mask, preferably at least three steps (i.e. defined by 2 discontinuity) and up to at least about ten steps (i.e. defined by n−1 discontinuity, where n equals a number of steps). An aggregate depth of the series of steps corresponds with a 180 degree phase change of photoexposure radiation. In addition, while the series of steps is illustrated as arced shaped steps, the invention is not limited to steps so formed, but rather other shaped steps may also be employed. Within the invention a pit sidewall having no discontinuities to define a plurality of steps into the pit is defined as a non-stepped sidewall. A pit sidewall having a minimum of one discontinuity to define a minimum of two steps is defined as a stepped sidewall.

Within the first preferred embodiment of the invention, the pit with the stepped sidewall is formed in a self aligned fashion incident to a sequential step wise: (1) lateral etching of a patterned opaque material layer formed upon a transparent substrate; and (2) isotropic etching of the transparent substrate.

Second Preferred Embodiment

FIG. 9 to FIG. 16 show a series of schematic cross-sectional diagrams illustrating the results of progressive stages in forming a phase shift photomask in accord with a second preferred embodiment of the invention.

Figure 9:
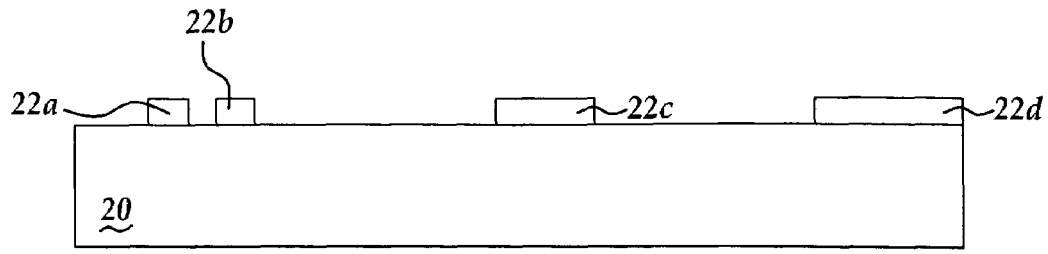
FIG. 9, FIG. 10, FIG. 11, FIG. 12, FIG. 13, FIG. 14, FIG. 15 and FIG. 16 show a series of schematic cross-sectional diagrams illustrating the results of progressive stages of fabricating an alternating phase shift photomask in accord with a second preferred embodiment of the invention.
Figure 10:
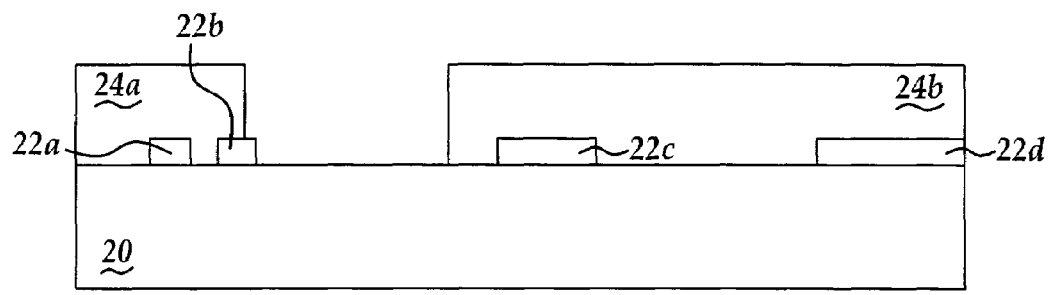

FIG. 9 corresponds generally with FIG. 1 and FIG. 10 corresponds generally with FIG. 2. Within FIGS. 1 and 2, the phase shift photomask comprises a transparent substrate 20 having formed thereover a pair of patterned photoresist layers and a series of patterned opaque material layers. The second preferred embodiment of the invention provides for a series of patterned opaque material layers 22a, 22b, 22c and 22d. The transparent substrate 20, the series of patterned opaque material layers 22a, 22b, 22c, 22d and 22e and the pair of patterned photoresist layers 24a and 24b may otherwise be formed of materials and dimensions analogous, equivalent or identical to the materials and dimensions employed for forming the corresponding structures within the phase shift photomask within the first preferred embodiment of the invention, as illustrated in FIGS. 1 and 2. Within the second preferred embodiment of the invention, the series of patterned opaque material layers 22a, 22b, 22c and 22d is typically formed employing a single lithographic process step which may employ either electron beam lithography or photolithography.

Figure 11:
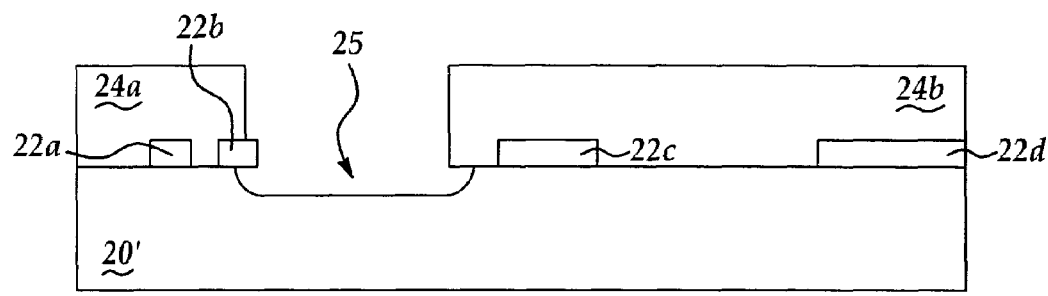

FIG. 11, shows the results of isotropically etching the transparent substrate 20 to form a pit 25 within a once isotropically etched transparent substrate 20'. The isotropic etching may be undertaken employing methods, materials and conditions analogous equivalent or identical to the methods, materials and conditions employed for isotropically etching the pit 15 within the once isoptropically etched transparent substrate 10' as illustrated within FIG. 3 within the first preferred embodiment of the invention.

Figure 12:
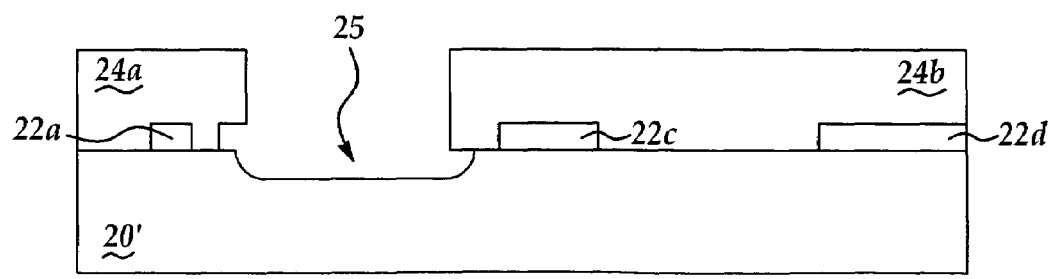

FIG. 12 shows the results of stripping the patterned opaque material layers 22b to expose an upper edge of the pit 25. The patterned opaque material layer 22b may be stripped employing methods and materials as are analogous, equivalent or identical to the methods and materials employed within the first preferred embodiment of the invention for laterally etching the patterned opaque material layer 12a.

Figure 13:
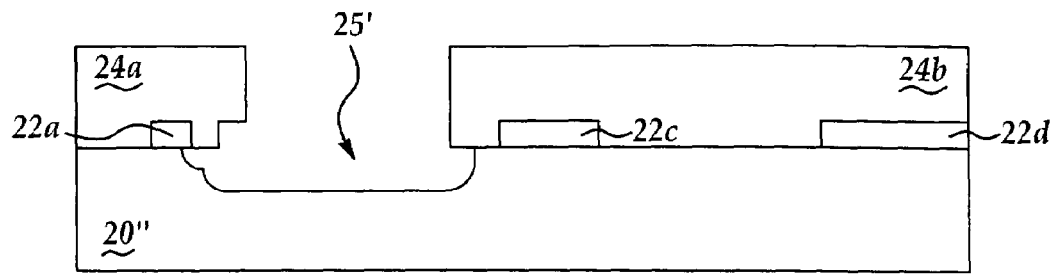

FIG. 13 shows the results of further etching the pit 25 to form a further etched pit 25' within a twice isotropically etched transparent substrate 20''. One sidewall of further etched pit 25' has a stepped sidewall providing two steps. The other sidewall is a smooth arc shaped sidewall without a step or discontinuity therein. The pit 25 may be further etched to form the further etched pit 25' employing methods, materials and conditions analogous, equivalent or identical to the methods, materials and conditions employed for etching the pit 15 to form the further etched pit 15' as illustrated in FIG. 5 within the first preferred embodiment of the invention.

Figure 14:
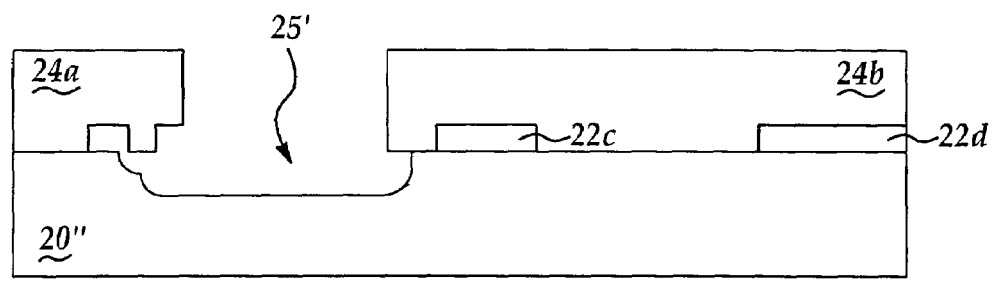

FIG. 14 shows the results of stripping the patterned opaque material layer 22a to expose an upper edge of the further etched pit 25'. The patterned opaque material layer 22a may be stripped employing methods, materials and conditions analogous equivalent or identical to the methods, materials and conditions employed for stripping the patterned opaque material layer 22b.

Figure 15:
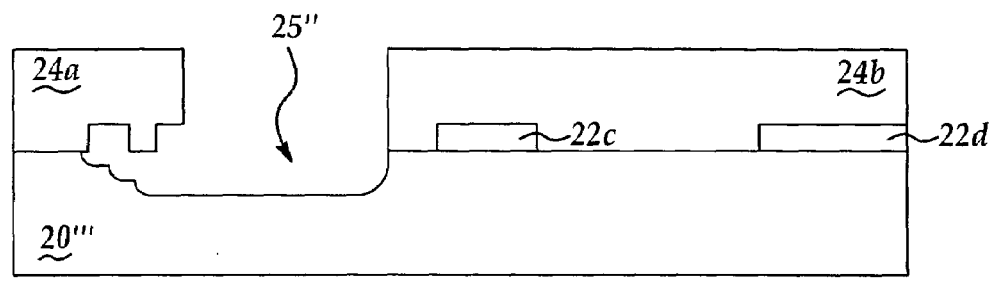

FIG. 15 shows the results of still further etching the further etched pit 25' to form a still further etched pit 25'' within a three times isotropically etched transparent substrate 20'''. Within FIG. 15, the edges of the still further etched pit 25'' terminate near the edges of the pair of patterned opaque material layers 22c and patterned photoresist layer 24a. The still further etched pit 25'' may be etched employing methods, materials and conditions analogous, equivalent or identical to the methods, materials and conditions employed for etching the still further etched pit 15'' as illustrated within FIG. 7.

Figure 16:
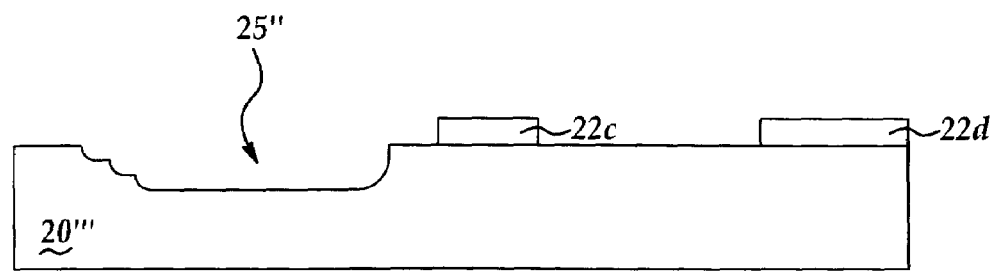

FIG. 16 shows the results of stripping the pair of patterned photoresist layers 24a and 24b from the three times isotropically etched transparent substrate 20'''. The pair of patterned photoresist layers 24a and 24b may be stripped employing methods and materials as are conventional in the microelectronic product fabrication art.

FIG. 16 shows a schematic cross-sectional diagram of a phase shift mask formed in accord with a second preferred embodiment of the invention. Analogously with the first preferred embodiment of the invention, the phase shift mask in accord with the second preferred embodiment of the invention is an alternating phase shift mask comprising a transparent substrate having formed thereupon a patterned opaque material layer that defines a non-transmissive region of the transparent substrate aligned beneath the patterned opaque material layer. The non-transmissive region separates a pair of transmissive regions one of which has formed therein a pit and the other of which does not. Within the alternating phase shift mask, the pit is formed with a stepped sidewall and an arc shaped non-sidewall. An overall depth of the pit corresponds with a 180 degree phase change of photoexposure radiation.

The preferred embodiments of the invention are illustrative of the invention rather than limiting of the invention. Revisions and modifications may be made to methods, materials, structures and dimensions in accord with the preferred embodiment of the invention while still providing embodiments in accord with the invention, further in accord with the accompanying claims.

What is claimed is:

1. A phase shift photomask comprising:
   a transparent substrate;
   a patterned opaque material layer formed upon the transparent substrate to define a non-transmissive region of the transparent substrate aligned beneath the patterned opaque material layer and an adjoining transmissive region of the transparent substrate not aligned beneath the patterned opaque material layer, wherein the transmissive region has formed therein a pit having a stepped sidewall wherein the stepped sidewall comprises a minimum of one arc shaped step.

2. The phase shift photomask of claim 1 wherein the pit has one stepped sidewall and one non-stepped sidewall.

3. The phase shift photomask of claim 1 wherein the stepped sidewall comprises from about three to about ten steps.

4. The phase shift photomask of claim 1 wherein an overall, depth of the pit having the stepped sidewall provides for a 180 degree phase change of photoexposure radiation.

5. The phase shift photomask of claim 1 further comprising a second transmissive region on an opposite side of the non-transmissive region from the transmissive region, where the second transmissive region does not have formed therein a pit.

6. A method for fabricating a phase shift photomask comprising:
providing a transparent substrate;
forming upon the transparent substrate a patterned opaque material layer;
sequentially and repetitively:
isotropically etching the transparent substrate at a location not covered by the patterned opaque material layer; and
laterally etching the patterned opaque material layer, to form a non-transmissive region of the transparent substrate beneath a multiply laterally etched patterned opaque material layer and an adjoining transmissive region of the transparent substrate not beneath the multiply laterally etched patterned opaque material layer, where the transmissive region of the transparent substrate has formed therein a pit having a stepped sidewall wherein the stepped sidewall comprises a minimum of one arc shaped step.

7. The method of claim 6 wherein the pit has one stepped sidewall and one non-stepped sidewall.

8. The method of claim 6 wherein the stepped sidewall comprises from about three to about ten steps.

9. The method of claim 6 wherein an overall depth of the pit having the stepped sidewall provides for a 180 degree phase change of photoexposure radiation.

10. The method of claim 6 wherein the transparent substrate further comprises a second transmissive region on an opposite side of the non-transmissive region from the transmissive region, where the second transmissive region does not have formed therein a pit.

11. The method of claim 6 wherein the sequential and repetitive isotropic etching of the transparent substrate and lateral etching of the patterned opaque material layer is undertaken in a self aligned fashion.

12. A method for fabricating a phase shift photomask comprising:
providing a transparent substrate;
forming upon the transparent substrate a laterally progressing series of patterned opaque material layers;
sequentially and repetitively:
isotropically etching the transparent substrate at a location not covered by the laterally progressing series of patterned opaque material layers; and
laterally progressively stripping the laterally progressing series of patterned opaque material layers, to form a non-transmissive region of the transparent substrate beneath a remaining non-stripped patterned opaque material layer and an adjoining transmissive region of the transparent substrate not beneath the remaining non-stripped patterned opaque material layer, where the transmissive region of the transparent substrate has formed therein a pit having a stepped sidewall wherein the stepped sidewall comprises a minimum of one arc shaped step.

13. The method of claim 12 wherein the pit has one stepped sidewall and one non-stepped sidewall.

14. The method of claim 12 wherein the stepped sidewall comprises from about three to about ten steps.

15. The method of claim 12 wherein an overall depth of the pit having the stepped sidewall provides for a 180 degree phase change of photoexposure radiation.

16. The method of claim 12 wherein the transparent substrate further comprises a second transmissive region on an opposite side of the non-transmissive region from the transmissive region, where the second transmissive region does not have formed therein a pit.

17. The method of claim 12 wherein the laterally progressing series of patterned opaque material layers is formed employing a single lithographic process step.

* * * * *